(12) United States Patent
Wagner et al.

(10) Patent No.: US 7,767,470 B2
(45) Date of Patent: Aug. 3, 2010

(54) SEMICONDUCTOR WAFERS WITH HIGHLY PRECISE EDGE PROFILE AND METHOD FOR PRODUCING THEM

(75) Inventors: Peter Wagner, Burghausen (DE); Hans Adolf Gerber, Burghausen (DE); Anton Huber, Burghausen (DE); Joerg Moser, Unterneukirchen (DE)

(73) Assignee: Siltronic AG, Munich (DE)

( * ) Notice: Subject to any disclaimer, the term of this patent is extended or adjusted under 35 U.S.C. 154(b) by 424 days.

(21) Appl. No.: 11/828,441

(22) Filed: Jul. 26, 2007

(65) Prior Publication Data
US 2008/0036040 A1    Feb. 14, 2008

(30) Foreign Application Priority Data
Aug. 9, 2006    (DE) .................. 10 2006 037 267

(51) Int. Cl.
*H01L 21/00* (2006.01)
(52) U.S. Cl. ............................ 438/5; 438/14
(58) Field of Classification Search ............... None
See application file for complete search history.

(56) References Cited

U.S. PATENT DOCUMENTS

| 5,738,563 | A | 4/1998 | Shibata |
| 6,465,328 | B1 | 10/2002 | Hashii et al. |
| 6,594,542 | B1 * | 7/2003 | Williams .................. 700/164 |
| 6,722,954 | B2 | 4/2004 | Hashimoto et al. |
| 2002/0135781 | A1 | 9/2002 | Singh et al. |
| 2004/0041143 | A1 | 3/2004 | Kim et al. |

FOREIGN PATENT DOCUMENTS

| EP | 0971398 A1 | 1/2000 |
| EP | 1050370 A2 | 11/2000 |
| KR | 2004-19871 | 6/2004 |

OTHER PUBLICATIONS

Patent Abstract of Japan corresponding to JP 2003-017444.

* cited by examiner

*Primary Examiner*—Scott B Geyer
(74) *Attorney, Agent, or Firm*—Brooks Kushman P.C.

(57) ABSTRACT

A semiconductor wafer has a front side, a rear side and an edge which runs along the circumference of the semiconductor wafer and which connects the front side and the rear side of the edge having a defined edge profile, the edge profile being substantially constant over the entire circumference of the semiconductor wafer. A method for producing such a wafer allows for production of a multiplicity of semiconductor wafers, the edge profile being substantially constant from semiconductor wafer to semiconductor wafer.

5 Claims, 1 Drawing Sheet

SEMICONDUCTOR WAFERS WITH HIGHLY PRECISE EDGE PROFILE AND METHOD FOR PRODUCING THEM

BACKGROUND OF THE INVENTION

1. Field of the Invention

The invention relates to a semiconductor wafer having a front side, a rear side and an edge which runs along the circumference of the semiconductor wafer and which connects the front side and the rear side and which has a defined edge profile, the edge profile being substantially constant over the entire circumference of the semiconductor wafer. It also relates to a multiplicity of semiconductor wafers, the edge profile being substantially constant from semiconductor wafer to semiconductor wafer. Moreover, the invention relates to a method for producing semiconductor wafers of this type.

2. Background Art

Semiconductor wafers, in particular silicon wafers, used for the production of microelectronic components, are produced by means of a multiplicity of machining steps. The first step involves producing a polycrystalline or monocrystalline ingot made from the semiconductor material. The ingot is separated into wafers, by means of which the crystal lattice damage caused by the separation is eliminated in a plurality of machining steps and the wafers are brought to a highly precise geometrical form.

The required flatness and plane-parallelism are imparted to the surfaces of the semiconductor wafers by suitable combinations of different treatments, for example single- or double-side lapping, etching and single- or double-side polishing. In addition, a defined edge profile is produced by edge rounding and edge polishing.

It became apparent, however, that the precision and accuracy of the edge profile achieved in accordance with the prior art no longer sufficed for semiconductor wafers used for producing the latest generations of microelectronic components. Relationships have recently been ascertained to an increased extent, between the edge profile and its precision and accuracy, and the yield in the production lines for components.

In accordance with the prior art, the edge profile of semiconductor wafers could only be measured with limited precision and accuracy. Moreover, owing to the type of measuring method, it was not possible to effect measurement over the entire circumference of the semiconductor wafers. The measurement has hitherto generally been effected by profile projection. In this case, the edge profile is projected by means of a light source parallel to the planar surfaces of the semiconductor wafer, the shadow casting by the edge profile parallel to the wafer circumferences recorded by means of a camera and then evaluated by suitable image processing methods and mathematical algorithms. No measurement was thereby possible in the region of the orientation features that are generally provided on the semiconductor wafers. A notch or a flattened region ("flat") on the circumference of the semiconductor wafer generally serve as an orientation feature. Although profile projection also functions, in principle, with non-polished edges, it does so with limited accuracy. The latter is dependent on the roughness of the surface in the region of the edge since a rougher edge leads to more scattered light and the profile is therefore no longer defined as well in the shadow casting. Moreover, profile projection does not enable measurement of the edge profile in the region of the notch or flat. Since the edge profile could be precisely determined only in the case of a polished edge, the state of the wafer edge before and after different process steps could only be compared with limited accuracy by means of profile projection. Therefore, process control of all the machining steps which alter the edge profile, in particular the edge machining steps, was also possible only to a very limited extent. Accordingly, the edge profiles of semiconductor wafers varied considerably both along the wafer circumference and in the region of the notch or flat even in the case of nominally identical specifications.

In order to solve this problem, JP 2003-017444 proposed determining the material removal during edge rounding, edge grinding and edge polishing by measurement of small depressions introduced into the semiconductor wafer for this purpose. As an alternative, U.S. Pat. No. 6,722,954 B2 describes measurement of material removal at a layer made of polycrystalline silicon specifically applied to a test wafer for this purpose. This method is complicated and is therefore not suitable for continuous process control. Moreover, the measurement is not possible on the semiconductor wafers themselves, but rather on only specially prepared test wafers.

It was furthermore attempted, by means of suitable process implementation during grinding of the front and rear sides of the semiconductor wafers, to alter the length of the facets provided on the two sides of the semiconductor wafers in a controlled manner, as disclosed in EP 0971398 A1 or U.S. Pat. No. 6,465,328 B1. Thus, EP 0971398 A1 describes a process flow in which the edge rounding is not effected directly after the separation of the semiconductor ingot into wafers, but rather only after a grinding step, which has the effect that all the wafers have an identical thickness. This is intended to ensure an identical length and height of the facets ("chamfer") for all the wafers. It has been found, however, that this measure does not suffice to ensure a defined and uniform edge profile in the finished machined semiconductor wafers as well.

To summarize, the form of the edge profile has hitherto been determined only by measuring methods of limited accuracy. The material removal in the region of the wafer edge is additionally controlled, if appropriate, by means of auxiliary constructions such as polycrystalline silicon layers or small holes produced intentionally. Accurate tracking of the profile form of the wafer edge over all the process steps is therefore not possible, in particular not in the region of the notch or flat. The edge profile of correspondingly fabricated semiconductor wafers is therefore subject to fluctuation over a wide range.

SUMMARY OF THE INVENTION

Therefore, an object on which the invention is based was to provide semiconductor wafers having a precise edge form. This and other objects are achieved by means of a semiconductor wafer having a front side, a rear side and an edge which runs along the circumference of the semiconductor wafer and which connects the front side and the rear side and which has a defined edge profile, wherein the parameters of the edge profile have the following standard deviations over the entire circumference of the semiconductor wafer:

standard deviation of the transition radius $r_1$ of the transition between the facet at the front side of the semiconductor wafer and the apex<12 µm, standard deviation of the transition radius $r_2$ of the transition between the facet at the rear side of the semiconductor wafer and the apex<10 µm, standard deviation of the facet heights $B_1$ at the front side and $B_2$ at the rear side of the semiconductor wafer in each case<5 µm, standard deviation of the facet length $A_1$ at the front side of the semiconductor wafer<11 µm, standard deviation of the facet length $A_2$ at the rear side of the semiconductor wafer<8 µm, and standard deviation of the facet angles $f_1$ at the front side and $\theta_2$ at the rear side of the semiconductor wafer in each case<0.5°.

The standard deviations specified are determined from measurement of the edge profile at a plurality of locations on the circumference of a single semiconductor wafer.

The object(s) are likewise achieved by means of a multiplicity of semiconductor wafers each having a front side, a rear side and an edge which runs along the circumference of the semiconductor wafer and which connects the front side and the rear side and which has a defined edge profile, wherein the parameters of the edge profile have the standard deviations specified above over the entire multiplicity of semiconductor wafers. In this case, the standard deviations are determined from measurements of the edge profile of each individual semiconductor wafer of the multiplicity of semiconductor wafers. The multiplicity of wafers are preferably produced in sequence.

Preferably, the abovementioned conditions in the case of substantially round semiconductor wafers are met not only on the round part of the circumference, but also in the region of the orientation feature. The semiconductor wafers according to the invention thus have a very precise edge profile that is complied with in narrow tolerances in all regions of the profile, on the entire circumference of the wafers as well as in the region of the notch or flat.

DETAILED DESCRIPTION OF THE PREFERRED EMBODIMENT(S)

Figure 1:
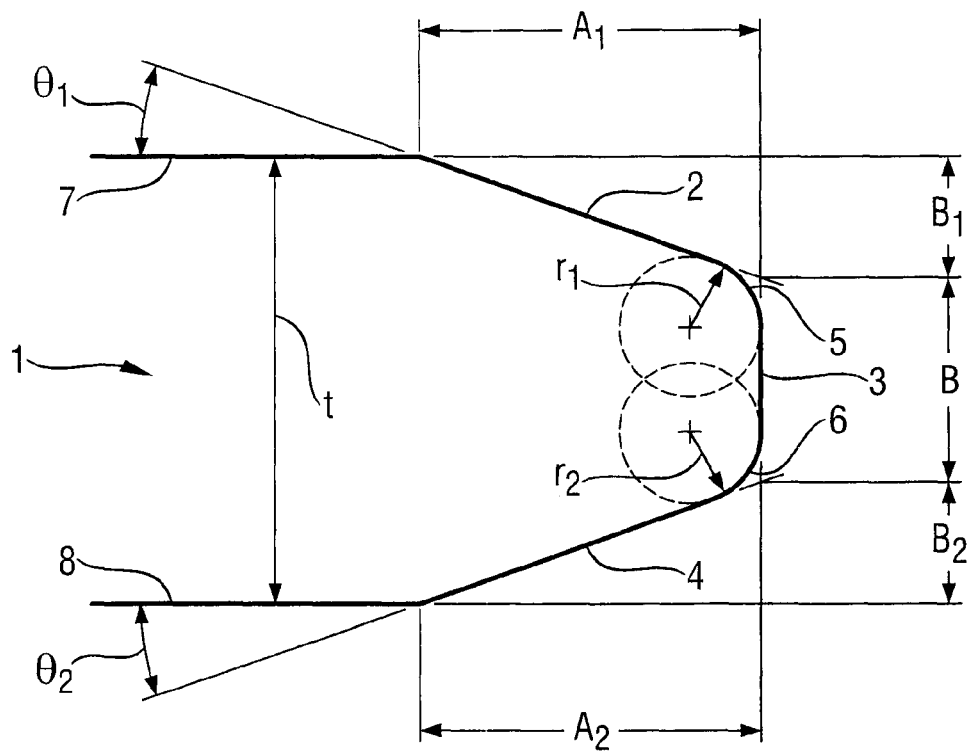
FIG. 1 illustrates parameters that can be used for completely describing an edge profile of a semiconductor wafer.

The edge profile of a semiconductor wafer 1 having the thickness t (FIG. 1) is subdivided—in cross section through the wafer—into three regions: a facet 2, i.e. a chamfered region on the front side, an apex 3 on the circumference, and once again a facet 4 on the rear side of the semiconductor wafer. The facets 2, 4, in each case, comprise a substantially straight section, the "chamfer", and a curved transition region 5, 6 to the apex 3.

The profile can be described by the following parameters:

Facet angles $\theta_1$ on the front side and $\theta_2$ on the rear side of the semiconductor wafer: angle between a reference plane and the chamfer of the respective facet. Either one of the planar wafer surfaces 7, 8 or for example a chuck surface can be used as reference plane. The measurement of the edge profile includes only a small region of the planar wafer surface, which results in an uncertain determination of the wafer surface. Therefore, it is often better to define the chuck surface as reference plane.

Facet lengths $A_1$ on the front side and $A_2$ on the rear side of the semiconductor wafer: distance between the point of intersection of the facet 2, 4 with the planar wafer surface 7, 8 and the outermost point of the semiconductor wafer, measured parallel to the defined reference plane.

Facet heights $B_1$ on the front side and $B_2$ on the rear side of the semiconductor wafer: distance between an extension of the planar wafer surface 7, 8 and the point of intersection of an extension of the facet 2, 4 with a line perpendicular to the reference plane through the outermost point of the semiconductor wafer. The apex length B results from the difference $B=t-(B_1+B_2)$ between the thickness t of the semiconductor wafer and the sum of the facet heights $B_1$, $B_2$. The apex may also comprise a plurality of straight sections.

Transition radii $r_1$ on the front side and $r_2$ on the rear side of the semiconductor wafer: radius of curvature of the respective transition region 5, 6 between chamfer and apex 3.

Apex angles β: angle between the apex and a perpendicular to the reference plane. (In FIG. 1 the apex angle β=0 since the apex runs perpendicular to the reference plane.) If the apex is described by a plurality of straight sections, a plurality of apex angles correspondingly exist.

Large variations of the edge profile are possible with these parameters. It is thereby also possible to describe edge profiles which have no apex 3 and in which the curved transition regions 5, 6 merge directly into one another, in which case, if appropriate, the transition radii $r_1$ and $r_2$ can be identical.

According to the invention, the parameters specified have a very small standard deviation from semiconductor wafer to semiconductor wafer or within a semiconductor wafer. Losses of yield caused by an imprecise edge geometry during the production of electronic components can be reliably avoided as a result.

The semiconductor wafers according to the invention can be produced by a method comprising the following steps:

a) separating a semiconductor wafer from a semiconductor ingot, b) machining the semiconductor wafer, the edge profile of the semiconductor wafer being altered, c) measuring the edge profile of the semiconductor wafer, d) ascertaining the location-dependent deviations of the measured edge profile from a desired edge profile, and e) altering the machining parameters in such a way that the subsequent machining of a further semiconductor wafer leads to an edge profile which has smaller deviations from the desired edge profile than the edge profile of the previously machined semiconductor wafer.

In step a), the semiconductor wafers are separated from a semiconductor ingot in accordance with the prior art, preferably using a multi-wire saw.

In step b), a first semiconductor wafer is subjected to a machining step that alters the profile of the wafer edge. These are primarily edge machining steps such as edge rounding or edge polishing, but also the surface machining steps which are customary in accordance with the prior art, such as grinding, lapping or polishing of the wafer surfaces. Grinding or polishing may relate to one side of the semiconductor wafer or to both sides. In step b), moreover, it is possible to carry out any other conceivable type of machining which has an influence on the edge profile, for example an etching treatment, a cleaning, or an epitaxial coating.

Figure 2:
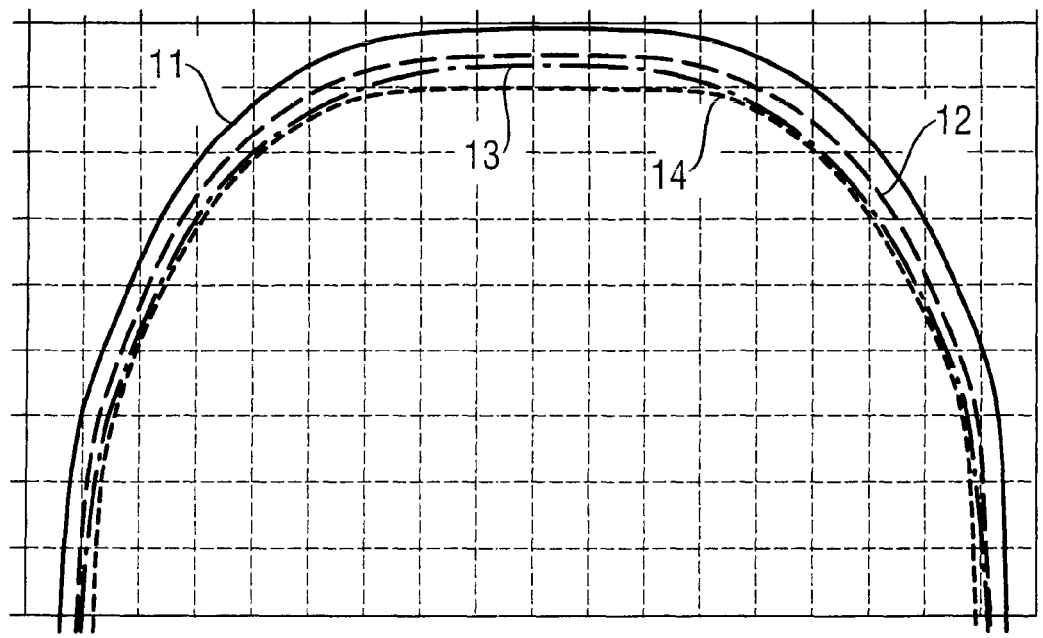
FIG. 2 shows one embodiment of the alteration of an edge profile in the course of machining a semiconductor wafer.

FIG. 2 shows by way of example how the edge profile is altered in the course of the machining of a semiconductor wafer. After a double-side grinding, the semiconductor wafer has an edge profile 11, for example, which is multiply altered by an etching treatment (edge profile 12), an edge polishing (edge profile 13) and the double-side polishing (edge profile 14).

After machining, the edge profile of the semiconductor wafer is measured exactly in step c) and the result is evaluated in step d). The measuring method is preferably based on a light section method in which one or a plurality of laser beams are passed over the wafer edge (front and rear sides of the semiconductor wafer) and the positions of the laser spots are recorded by means of CCD cameras and evaluated by suitable software. A wafer edge profile is thereby created, from which the profile parameters such as facet angles $\theta_1$, $\theta_2$, facet lengths $A_1$, $A_2$, facet heights $B_1$, $B_2$ and transition radii $r_1$, $r_2$ are then obtained by suitable methods. It is thus possible to precisely measure the profile of wafer edges that are not highly polished, in particular in the region of the notch or flat. Suitable measuring apparatuses are commercially available. If the semiconductor wafer already has a polished edge at the time when the edge profile is measured, the light section method is not as well suited since the edge scatters too little light. In this case, the above-described method of profile projection is preferably used for measuring the edge profile. The combination of light section method and profile projection is suitable for the highly precise and accurate determination of the edge profile in any machining state of the edge and in all regions, on the entire circumference and in the region of the notch and flat.

In step e), the machining step is optimized on the basis of the measurement and evaluation carried out previously, with the result that the edge profile of the next semiconductor wafer to be machined experiences an improvement relative to the previously machined semiconductor wafer if the edge profile of the previously machined semiconductor wafer had a deviation from the necessary precision. The optimization consists for example of a specific control of the process parameters and tools.

In a preferred embodiment of the method according to the invention, measurement of the edge profile is carried out not only after the machining but additionally beforehand. The results of the two measurements are compared, preferably by difference formation. As a result, the material removal caused by the machining step carried out between the measurements is determined in a location-dependent manner over the entire profile of the edge. The influences of different machining steps can be separated in this way, which permits further improved process control.

The difference between two edge profiles is the shortest distance point by point between the two edge profiles plotted one above another before and after a machining step (see FIG. 2), and is determined as follows: at each point of the later edge profile (e.g. edge profile 12 after an etching treatment), a perpendicular to the edge profile is constructed. The distance between the point of intersection of the perpendicular with the earlier edge profile (e.g. edge profile 11 after double-side grinding, i.e. before the etching treatment) and the point of intersection of the perpendicular with the later edge profile (e.g. edge profile 12) corresponds to the difference between the two edge profiles at said point. A plotting of these differences along a length- or angle-based development of the later edge profile is the difference profile. It is thereby possible to find the removal in the different regions of the edge profile. Quantitatively, it is possible to determine the removal depending on the required statement e.g. by averaging (linear or quadratic) of the difference profile or specific regions of the difference profile. The causes of deviations from the desired profile that occur in a specific machining step can easily be determined on the basis of the difference profile.

The method according to the invention also has the advantage that no specially prepared test wafers are necessary. This saves expense, on the one hand, and enables continuous process control, on the other hand. The method also makes it possible to produce semiconductor wafers whose edge profile varies to a significantly lesser extent than in accordance with the prior art.

In one preferred embodiment of the method steps c) and d) of the method are carried out after an edge rounding by means of a profiled grinding disk and the method of the invention is thus applied to the edge rounding. This is preferred since the edge rounding by its nature has a very great influence on the edge profile. In accordance with the prior art, the edge rounding is generally effected by grinding the wafer edge using a profiled tool, for example a grinding disk, the negative form of which corresponds to the edge profile to be produced. During grinding, the negative form of the tool is copied positively on to the edge of the semiconductor wafer. The precision and accuracy of the edge profile of the semiconductor wafers depend on the position of the grinding disk with respect to the semiconductor wafer during the grinding operation and on the wear of this grinding disk.

In this preferred embodiment, in step e), the position of the grinding disk is readjusted if a deviation of the facet length of the edge profile from the desired value that goes beyond the amount afforded tolerance is ascertained in step d). By contrast, the grinding disk is changed if a deviation of another parameter of the edge profile from the desired value that goes beyond the amount afforded tolerance is ascertained in step d). Both hold true not only for the edge rounding on the wafer circumference but also on the flat or in the notch.

The edge profile of subsequently machined semiconductor wafers is monitored and controlled by this feedback. Such feedback is not provided in the prior art. This means that a reduced variation of the parameters is achieved by comparison with the prior art. The standard deviations of the above-defined parameters of the edge profile after the edge rounding are specified in table 1. In this case, the measurement series U1 and U2 relate to a measurement at 16 measurement positions along the wafer circumference, wherein the semiconductor wafers measured in U1 were machined in accordance with the prior art without application of the method according to the invention and the semiconductor wafers measured in U2 were machined according to the invention with profile measurement and feedback with respect to the edge rounding. A similar improvement is achieved in the notch of the wafers (measurement series N1, N2; N1 analogous to U1 in accordance with the prior art, N2 analogous to U2 according to the invention), such that the variation of the parameters is now comparable on the wafer circumference and in the notch. In addition to the parameters defined above, Table 1 also specifies the symmetry deviation ΔSym of the edge profile, that is to say a comparison of the parameters for the front and rear sides of the semiconductor wafers, and also the deviation of the edge profile from nominally straight or circular regions (profile deformation Def).

TABLE 1

| Measurement Series | $r_1$ [μm] | $r_2$ [μm] | $B_1$ [μm] | $B_2$ [μm] | $A_1$ [μm] | $A_2$ [μm] | ΔSym [μm] | Def [μm] | $\theta_1$ [°] | $\theta_2$ [°] |
|---|---|---|---|---|---|---|---|---|---|---|
| U1 | 5.77 | 5.77 | 5.33 | 7.22 | 14.42 | 19.85 | 22.63 | 0.30 | 0.19 | 0.21 |
| U2 | 2.52 | 2.52 | 4.00 | 5.04 | 10.64 | 11.53 | 17.67 | 0.29 | 0.13 | 0.18 |
| N1 | 2.20 | 2.20 | 5.79 | 6.13 | 13.86 | 16.54 | 28.43 | 0.49 | 0.16 | 0.20 |
| N2 | 1.24 | 1.24 | 5.20 | 5.58 | 12.12 | 13.80 | 24.36 | 0.62 | 0.10 | 0.11 |

It is particularly preferred, in this case as well, to carry out measurement of the edge profile in each case before and after the edge rounding.

Furthermore, it is preferred for the inventive method to be applied to edge polishing. In this case, in step e), the position of the polishing tool is readjusted if a deviation of the edge profile from the desired profile that goes beyond the amount afforded tolerance is ascertained in step d). Preferably, the material removal is determined exactly by measurement before and after the edge polishing by forming the difference between the measured profiles, and the tool is correspondingly readjusted.

An application of the method according to the invention to double-side polishing is also preferred: thus, the carriers which are used during the double-side polishing and which receive the semiconductor wafers can be chosen according to the edge profile to be produced.

It is also particularly preferred for the described measurements and evaluations of steps c) and d) to be carried out before and after all the machining steps in the course of the production process which have a significant influence on the edge profile. These are, in particular, all machining steps having considerable material removal, such as grinding, lapping, etching, polishing, in each case of the wafer surfaces or of the wafer edge. An epitaxial coating can also have a considerable influence on the edge profile. In this way, a precise edge form can be ensured over all of the machining steps through to the end product.

Like Table 1, Table 2 represents the standard deviations of the parameters described, but for finished machined semiconductor wafers that have undergone all the machining steps including double-side polishing. In this case, the measurement series U3 and U4 once again relate to a measurement at 16 measurement positions along the wafer circumference, in which case the semiconductor wafers measured in U3 were machined in accordance with the prior art without application of the method according to the invention, and the semiconductor wafers measured in U4 were machined according to the invention with profile measurement and feedback with respect to all the machining steps that influence the edge profile. A significant reduction of the standard deviations of all the parameters by comparison with the prior art is evident.

TABLE 2

| Measurement Series | $r_1$ [μm] | $r_2$ [μm] | $B_1$ [μm] | $B_2$ [μm] | $A_1$ [μm] | $A_2$ [μm] | ΔSym [μm] | Def [μm] | $\theta_1$ [°] | $\theta_2$ [°] |
|---|---|---|---|---|---|---|---|---|---|---|
| U3 | 24.47 | 28.26 | 12.14 | 13.45 | 12.37 | 14.13 | 14.88 | 0.87 | 2.08 | 2.34 |
| U4 | 11.14 | 9.80 | 4.75 | 3.10 | 10.96 | 7.11 | 14.53 | 0.37 | 0.48 | 0.25 |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing semiconductor wafers having an edge profile, comprising the following steps:
    a) separating a semiconductor wafer from a semiconductor ingot;
    b) measuring the edge profile of the semiconductor wafer, machining the semiconductor wafer, the edge profile of the semiconductor wafer being altered, wherein the edge profile of the semiconductor wafer after machining comprises a facet on each of the front and rear sides of the semiconductor wafer;
    c) again measuring the edge profile of the semiconductor wafer, comparing the results of the edge profile measuring in step b) with the edge profile measuring in step c) and thereby determining the material removal caused by the machining in a location-dependent manner in a multiplicity of positions over the edge profile;

d) ascertaining the location-dependent deviations of the measured edge profile from a desired edge profile, and e) altering the machining parameters in such a way that a subsequent machining of a further semiconductor wafer leads to an edge profile which has smaller deviations from the desired edge profile than the edge profile of the previously machined semiconductor wafer.

2. The method of claim 1, wherein the machining in step b) is selected from a group consisting of edge rounding, edge polishing, grinding of at least one side, lapping, etching, polishing of at least one side, cleaning, epitaxial coating, or combinations thereof.

3. The method of claim 1, wherein, in step b), the machining is carried out by means of a profiled grinding disk, and wherein, in step e), readjusting the position of the grinding disk if a deviation from a desired value of at least one of the facet lengths $A_1$ at the front side of the semiconductor wafer and $A_2$ at the rear side of the semiconductor wafer that goes beyond an afforded tolerance is ascertained in step d), or changing the grinding disk if a deviation of another parameter of the edge profile from the desired value that goes beyond the afforded tolerance is ascertained in step d).

4. The method of claim 1, wherein, in step b), an edge polishing is carried out by means of a polishing tool and wherein, in step e), the position of the polishing tool is readjusted if a deviation of the edge profile from the desired profile that goes beyond an afforded tolerance is ascertained in step d).

5. The method of claim 1, wherein the edge profile is measured by means of a light section method if the edge is not polished, and wherein the edge profile is measured by means of a profile projection if the edge of the semiconductor wafer is polished.

* * * * *